(12) United States Patent
Hayashi

(10) Patent No.: US 12,349,451 B2
(45) Date of Patent: Jul. 1, 2025

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventor: Shingo Hayashi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 531 days.

(21) Appl. No.: 17/565,004

(22) Filed: Dec. 29, 2021

(65) Prior Publication Data

US 2022/0254915 A1 Aug. 11, 2022

(30) Foreign Application Priority Data

Feb. 9, 2021 (JP) .................................. 2021-019083

(51) Int. Cl.
*H10D 84/00* (2025.01)
*H01L 21/265* (2006.01)
(Continued)

(52) U.S. Cl.
CPC ......... *H10D 84/144* (2025.01); *H10D 12/031* (2025.01); *H10D 62/53* (2025.01);
(Continued)

(58) Field of Classification Search
CPC .............. H01L 21/041; H01L 21/046; H01L 21/26533; H10D 62/107; H10D 62/157;
(Continued)

(56) References Cited

U.S. PATENT DOCUMENTS

2013/0009171 A1* 1/2013 Harada ............... H01L 21/2007
257/77
2017/0141206 A1 5/2017 Koga
(Continued)

FOREIGN PATENT DOCUMENTS

JP 2017092367 A 5/2017
JP 6218773 B2 10/2017
(Continued)

OTHER PUBLICATIONS

Japanese Office Action dated Oct. 29, 2024, in the counterpart Japanese Patent Application No. 2021-019083.
(Continued)

*Primary Examiner* — Fazli Erdem
(74) *Attorney, Agent, or Firm* — Rabin & Berdo, P.C.

(57) ABSTRACT

A silicon carbide semiconductor device includes a silicon carbide semiconductor substrate of a first conductivity type, a first semiconductor layer of the first conductivity type, a second semiconductor layer of the first conductivity type, a third semiconductor layer of the first conductivity type, a fourth semiconductor layer of a second conductivity type, first semiconductor regions of the first conductivity type, gate insulating films, gate electrodes, a first electrode, and a second electrode. When a current flows from the first electrode to the second electrode, a peak light emission intensity at a wavelength close to 390 nm is lower than a peak light emission intensity at a wavelength close to 500 nm.

3 Claims, 7 Drawing Sheets

(51) Int. Cl.
*H10D 12/01* (2025.01)
*H10D 62/53* (2025.01)
*H10D 62/832* (2025.01)
*H10D 30/66* (2025.01)

(52) U.S. Cl.
CPC ... *H10D 62/8325* (2025.01); *H01L 21/26533* (2013.01); *H10D 30/668* (2025.01)

(58) Field of Classification Search
CPC . H10D 62/393; H10D 62/8325; H10D 84/144
USPC .......................................................... 257/77
See application file for complete search history.

(56) References Cited

U.S. PATENT DOCUMENTS

| | | | |
|---|---|---|---|
| 2018/0269313 A1* | 9/2018 | Bina | ............... H01L 29/8083 |
| 2019/0040545 A1 | 2/2019 | Nakamura et al. | |
| 2019/0165102 A1* | 5/2019 | Fujimoto | ............ H01L 29/0878 |
| 2019/0198620 A1* | 6/2019 | Fujimoto | ............ H01L 29/1095 |
| 2020/0203513 A1* | 6/2020 | Konrath | ............. H01L 29/0696 |
| 2020/0295141 A1 | 9/2020 | Okumura | |
| 2021/0167173 A1* | 6/2021 | Fujimoto | .............. H01L 21/046 |
| 2022/0069087 A1* | 3/2022 | Hayashi | ............. H01L 29/1608 |

FOREIGN PATENT DOCUMENTS

| | | |
|---|---|---|
| JP | 2019-102493 A | 6/2019 |
| JP | 2019115220 A | 7/2019 |
| JP | 2020150180 A | 9/2020 |
| WO | 2017094764 A1 | 6/2017 |

OTHER PUBLICATIONS

Japanese Office Action dated Feb. 18, 2025, in the counterpart Japanese Patent Application No. 2021-019083.

* cited by examiner m-PLANE

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2021-019083, filed on Feb. 9, 2021, the entire contents of which are incorporated herein by reference.

BACKGROUND OF THE INVENTION

1. Field of the Invention

Embodiments of the invention related to a silicon carbide semiconductor device and a method of manufacturing a silicon carbide semiconductor device.

2. Description of the Related Art

Silicon carbide (SiC) is expected as a next generation semiconductor material to replace silicon (Si). Compared to a conventional semiconductor device element using silicon as a semiconductor material, a semiconductor device element using silicon carbide as a semiconductor material (hereinafter, silicon carbide semiconductor device) has various advantages such as enabling resistance of a device element in an ON state to be reduced to a few hundredths and application under higher temperature (at least 200 degrees C.) environments. These advantages are due to characteristics of the material itself in that a band gap of silicon carbide is about 3 times larger than that of silicon and dielectric breakdown field strength thereof is nearly an order of magnitude greater than that of silicon.

Up to now, Schottky barrier diodes (SBDs) and vertical metal oxide semiconductor field effect transistors (MOSFETs) having a trench gate structure or planar gate structure have become commercialized as silicon carbide semiconductor devices.

A planar gate structure is a MOS gate structure in which a MOS gate is provided in a flat plate-like shape on a front surface of a semiconductor substrate. A trench gate structure is a MOS gate structure in which a MOS gate is embedded in a trench formed in a semiconductor substrate (semiconductor chip), at a front surface thereof and a channel (inversion layer) is formed along a sidewall of the trench in a direction orthogonal to the front surface of the semiconductor substrate. Therefore, compared to the planar gate structure in which a channel is formed along the front surface of the semiconductor substrate, unit cell (constituent unit of device element) density per unit area may be increased and current density per unit area may be increased, which are advantageous in terms of cost.

FIG. 12 is a cross-sectional view depicting a trench gate structure of a conventional silicon carbide semiconductor device. A structure of the conventional silicon carbide semiconductor device is described taking a trench-type MOSFET 170 as an example. Regarding the trench gate structure, an $n^-$-type silicon carbide epitaxial layer 102 is deposited on a front surface of an $n^+$-type silicon carbide substrate 101. At a first side of $n^-$-type silicon carbide epitaxial layer opposite to a second side thereof facing the $n^+$-type silicon carbide substrate, an n-type high-concentration region 105 is provided. First $p^+$-type base regions 103 are selectively provided between trenches 116 of surfaces of the n-type high-concentration region 105. In the n-type high-concentration region 105, second $p^+$-type base regions 104 are selectively provided so as to underlie the entire area of the bottoms of the trenches 116, respectively.

MOS gates of the trench gate structure are configured by a p-type base layer 106, $n^+$-type source regions 107, $p^+$-type contact regions 108, the trenches 116, gate insulating films 109, and gate electrodes 110. The $p^+$-type contact regions 108 may be omitted.

Further, an interlayer insulating film 111 is provided on the gate electrodes 110; and a source electrode 112 is provided in contact with the $n^+$-type source regions 107 and the $p^+$-type contact regions 108 in openings of the interlayer insulating film 111. A barrier metal 114 may be provided between the interlayer insulating film 111 and the source electrode 112. A back electrode 113 constituting a drain electrode is provided on a back surface of the $n^+$-type silicon carbide substrate 101.

The vertical MOSFET having such a structure has a built-in parasitic pn diode formed between the source and drain by the p-type base layer 106 and the $n^-$-type silicon carbide epitaxial layer 102. The parasitic pn diode may be operated by applying a high potential to the source electrode 112, whereby current flows in a direction toward the $n^+$-type silicon carbide substrate 101, from the $p^+$-type contact regions 108 and through the p-type base layer 106 and the $n^-$-type silicon carbide epitaxial layer 102. In this manner, in the MOSFET, unlike an IGBT, a parasitic pn diode is built-in, whereby a free wheeling diode (FWD) may be omitted, contributing to cost reductions and size reductions. Hereinafter, the parasitic pn diode of the MOSFET is referred to as a body diode.

Here, in the $p^+$-type contact regions 108, holes (positive holes) that are minority carriers are present while in the $n^+$-type silicon carbide substrate 101 and the $n^-$-type silicon carbide epitaxial layer 102 electrons are present. Therefore, when current passes through the body diode, holes are injected from the $p^+$-type contact regions 108 and recombination of the electrons and the holes occurs in the $n^-$-type silicon carbide epitaxial layer 102 or the $n^+$-type silicon carbide substrate 101. At this time, if there are defects in the crystal of the $n^+$-type silicon carbide substrate 101, due to generated recombination energy (3 eV) equivalent to the band gap, basal plane dislocations (BPDs) that are one type of crystal defect present in the $n^+$-type silicon carbide substrate 101 move and single Shockley stacking faults (1SSFs) between two basal plane dislocations expand.

When a stacking fault expands, ON resistance of the MOSFET and forward voltage of the body diode increase because current does not easily pass through the stacking fault. When such operation continues, the stacking fault expands cumulatively and therefore, loss occurring in an inverter circuit increases over time and the amount of generated heat also increases, whereby device failure may occur.

Therefore, as depicted in FIG. 12, an n-type boundary layer 120 and a high-concentration $n^+$-type buffer layer 121 are provided between the $n^-$-type silicon carbide epitaxial layer 102 and the $n^+$-type silicon carbide substrate 101. For example, by forming a highly doped layer such as the high-concentration $n^+$-type buffer layer 121 doped with nitrogen (N) at a high concentration, lifetime killers are introduced, recombination of holes from the $n^-$-type silicon carbide epitaxial layer 102 is prompted, whereby the concentration of the holes reaching the $n^+$-type silicon carbide substrate 101 is controlled and the generation of stacking faults and increases in the area thereof are suppressed. Further, the n-type boundary layer 120 has an impurity concentration lower than an impurity concentration of the n⁺-type silicon carbide substrate 101 and, for example, is doped with nitrogen. The n-type boundary layer 120 is provided to prevent crystal defects of the n⁺-type silicon carbide substrate 101 from being transmitted to the n⁻-type silicon carbide epitaxial layer 102.

Further, it is commonly known that a semiconductor device having a low ON resistance may be obtained by a substrate fabricated from a silicon carbide having a single crystal structure, being set to have a physical property in which, in a photoluminescence measurement, a ratio of a peak intensity at a wavelength close to 500 nm to a peak intensity at a wavelength close to 390 nm is at most 0.1 (refer to Japanese Patent No. 6218773).

Further, a silicon carbide semiconductor device that is low cost and can stably suppress expansion of stacking faults by an injection of protons into a region at least 3 μm from a semiconductor substrate side, with a concentration thereof in a range from $1 \times 10^{13}/cm^3$ to $1 \times 10^{15}/cm^3$ is commonly known (refer to Japanese Laid-Open Patent Publication No. 2019-102493).

SUMMARY OF THE INVENTION

According to an embodiment of the invention, a silicon carbide semiconductor device includes: a silicon carbide semiconductor substrate of a first conductivity type, having a first main surface and a second main surface opposite to each other; a first semiconductor layer of the first conductivity type, provided on the first main surface of the silicon carbide semiconductor substrate, the first semiconductor layer having an impurity concentration lower than an impurity concentration of the silicon carbide semiconductor substrate, the first semiconductor layer having a first surface and a second surface opposite to each other, the second surface facing the silicon carbide semiconductor substrate; a second semiconductor layer of the first conductivity type, provided on the first surface of the first semiconductor layer, the second semiconductor layer having a first surface and a second surface opposite to each other, the second surface of the second semiconductor layer facing the first semiconductor layer; a third semiconductor layer of the first conductivity type, provided on the first surface of the second semiconductor layer, the third semiconductor layer having an impurity concentration lower than the impurity concentration of the silicon carbide semiconductor substrate, the third semiconductor layer having a first surface and a second surface opposite to each other, the second surface of third semiconductor layer facing the second semiconductor layer; a fourth semiconductor layer of a second conductivity type, provided on the first surface of the third semiconductor layer, the fourth semiconductor layer having first surface and a second surface opposite to each other, the second surface of the fourth semiconductor layer facing the third semiconductor layer; a first semiconductor region of the first conductivity type, selectively provided in the fourth semiconductor layer, at the first surface of in the fourth semiconductor layer; a gate electrode provided on at least a portion of a surface of the fourth semiconductor layer, between the third semiconductor layer and the first semiconductor region via a gate insulating film; a first electrode provided on surfaces of the first semiconductor region and the fourth semiconductor layer; and a second electrode provided on the second main surface of the silicon carbide semiconductor substrate. A light generated in response to a current flowing from the first electrode to the second electrode has an intensity profile having a first peak and a second peak respectively approximately at 390 nm and 500 nm, and an intensity at the first peak is lower than an intensity at the second peak.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
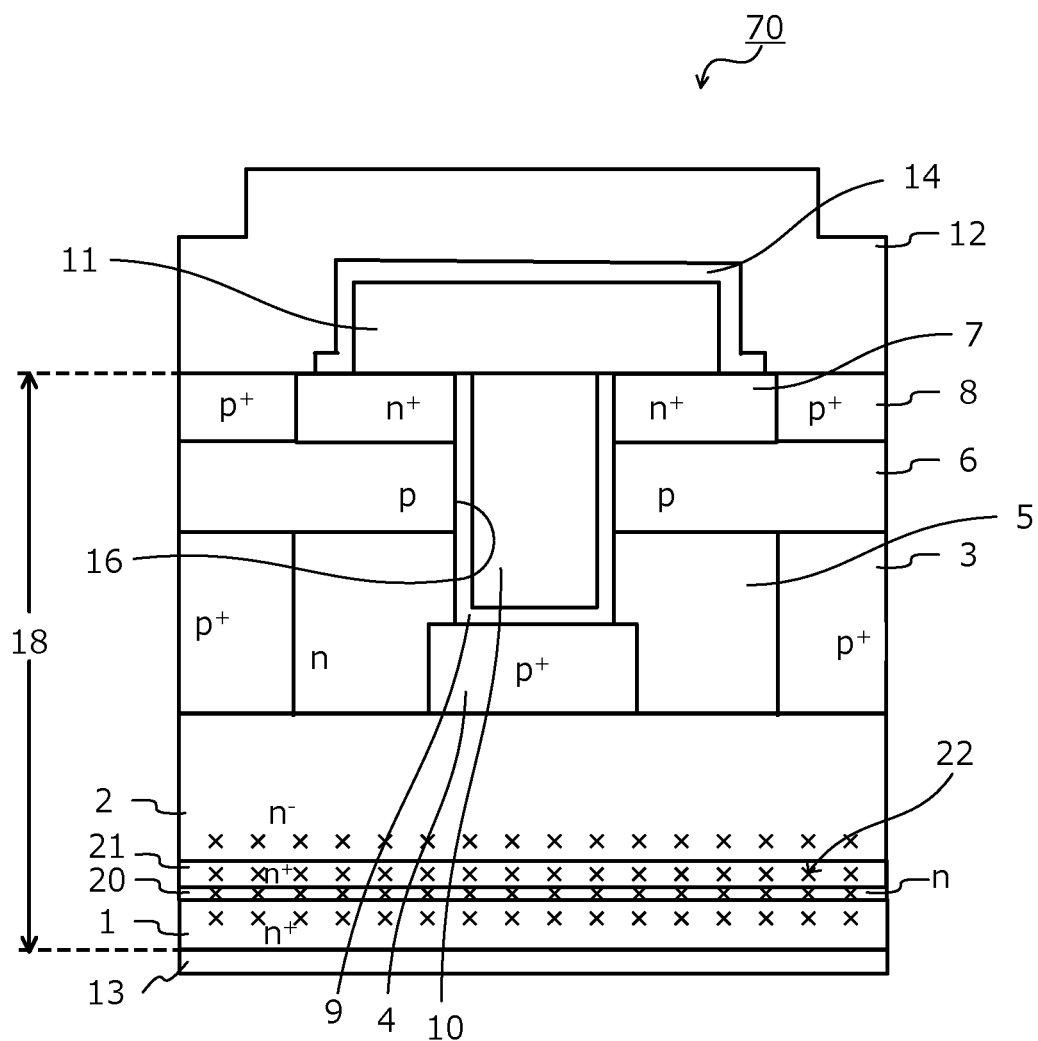
FIG. 1 is a cross-sectional view of a structure of a silicon carbide semiconductor device according to an embodiment.

First, problems associated with the conventional techniques are discussed. The silicon carbide semiconductor device emits light when the body diode is energized and electrons and positive holes recombine. At this time, band edge emission for a wavelength close to 390 nm and light emission for a wavelength close to 500 nm due to the energy level of an impurity by ion implantation occur. Under conditions of high temperature and large current close to the rating of the silicon carbide semiconductor device, the intensity of the band edge emission at a wavelength close to 390 nm increases. Due to this light emission, charge is excited and becomes trapped in an oxide film constituting the gate insulating films 109. As a result, a problem arises in that due to the charge in the oxide film, the threshold voltage (Vth) fluctuates and device characteristics degrade. For example, during operation, the ON resistance may increase and loss may occur.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. In the present description, when Miller indices are described, "−" means a bar added to an index immediately after the "−", and a negative index is expressed by prefixing "−" to the index. Further, with consideration of variation in manufacturing, description indicating the same or equal may be within 5%.

A semiconductor device according to the present invention is configured using a wide band gap semiconductor. In the embodiment, a silicon carbide semiconductor device fabricated (manufactured) using, for example, silicon carbide (SiC) as a wide band gap semiconductor is described taking a trench-type MOSFET 70 as an example. FIG. 1 is a cross-sectional view of a structure of the silicon carbide semiconductor device according to an embodiment. In FIG. 1, only an active region through which a main current of the trench-type MOSFET 70 flows is depicted.

As depicted in FIG. 1, the silicon carbide semiconductor device according to the embodiment is configured using a silicon carbide semiconductor base 18 in which on a first main surface (front surface), for example, a (0001)-plane (Si-face) of an n$^+$-type silicon carbide substrate (silicon carbide semiconductor substrate of a first conductivity type) 1, an n-type boundary layer (first semiconductor layer of the first conductivity type) 20, a high-concentration n$^+$-type buffer layer (second semiconductor layer of the first conductivity type) 21, an n$^-$-type silicon carbide epitaxial layer (third semiconductor layer of the first conductivity type) 2, and a p-type base layer (fourth semiconductor layer of a second conductivity type) 6 are sequentially stacked.

In the n$^-$-type silicon carbide epitaxial layer 2, at a first surface thereof opposite to a second surface thereof facing the n$^+$-type silicon carbide substrate 1, n-type high-concentration regions 5 may be provided. The n-type high-concentration regions 5 are a high-concentration n-type drift layer having an impurity concentration lower than an impurity concentration of the n$^+$-type silicon carbide substrate 1 and higher than an impurity concentration of the n$^-$-type silicon carbide epitaxial layer 2.

The n-type boundary layer 20 has an impurity concentration lower than the impurity concentration of the n$^+$-type silicon carbide substrate 1 and, for example, is doped with nitrogen (N). The n-type boundary layer 20 fixes an origin of expansion of stacking faults and is provided so that crystal defects of the n$^+$-type silicon carbide substrate 1 are not transmitted to the n$^-$-type silicon carbide epitaxial layer 2. The high-concentration n$^+$-type buffer layer 21 is a highly doped layer, for example, doped with nitrogen at a high concentration.

In the trench-type MOSFET 70 of the embodiment, a particle beam of protons (p), helium (He), etc. is irradiated from a back surface, whereby point defects 22 are introduced in a range from the substrate (the n$^+$-type silicon carbide substrate 1) to the drift layer (the n$^-$-type silicon carbide epitaxial layer 2). The point defects 22 are recombination centers, a percentage of light emission at a wavelength close to 500 nm increases, and light emission during body diode conduction (when current flows from a source electrode 12 to a back electrode 13) shifts to a long wavelength side. As a result, in the trench-type MOSFET 70 of the embodiment, during body diode conduction, a peak light emission intensity (maximum intensity) of a wavelength close to 390 nm is lower than a peak light emission intensity (maximum intensity) of a wavelength close to 500 nm. For example, under a condition of 100 degrees C., when the body diode is conducted, the peak light emission intensity at a wavelength close to 390 nm may be preferably 1/20 of the peak light emission intensity at a wavelength close to 500 nm and more preferably may be 1/100. Suppression of light emission at a wavelength close to 390 nm of a high energy in this manner may suppress the trapping of charge in a SiO$_2$ oxide film, thereby suppressing fluctuation of Vth and stabilizing device characteristics.

Figure 2:
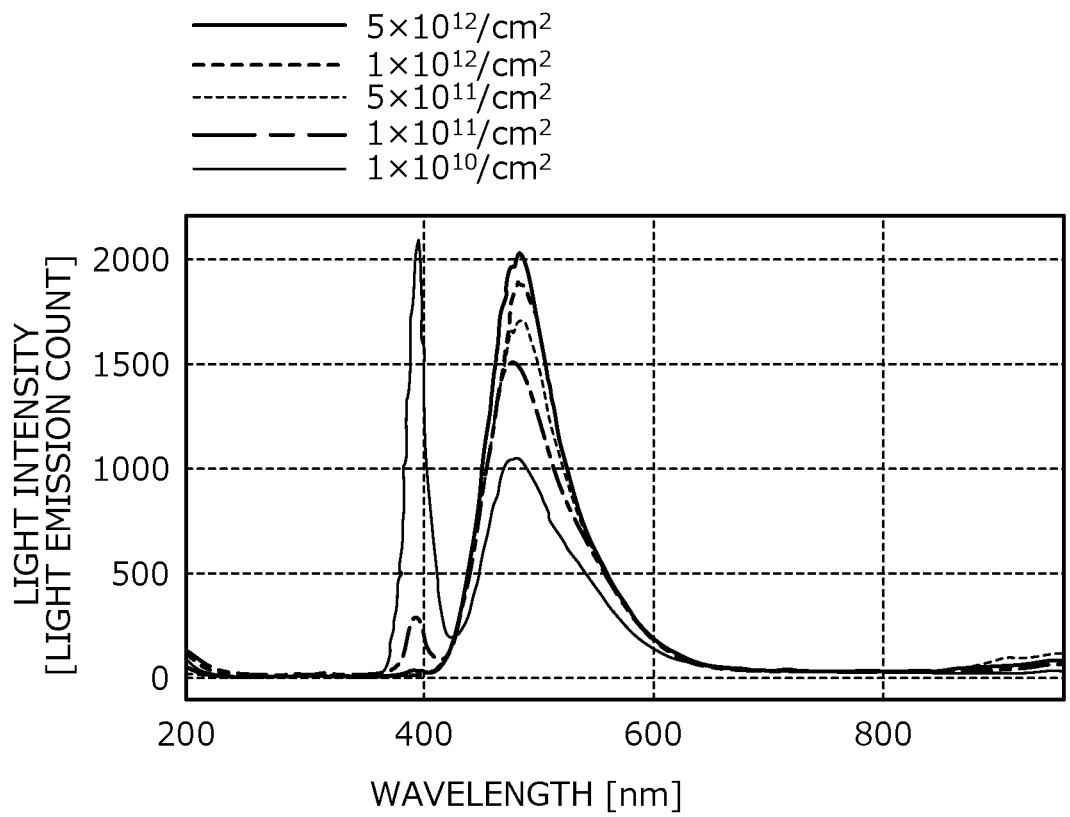
FIG. 2 is a graph depicting light emission intensity of a body diode after proton irradiation.
Figure 3:
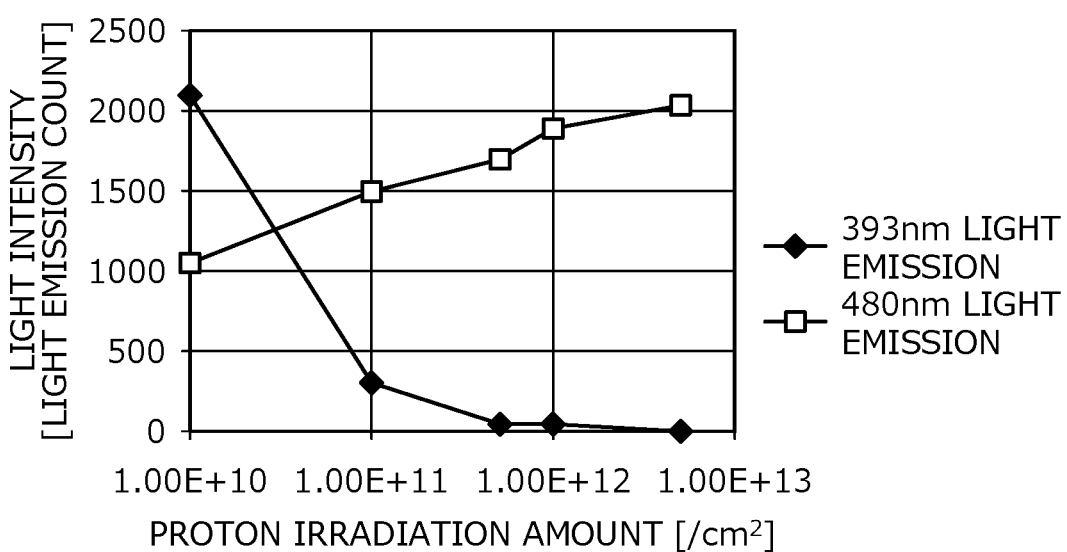
FIG. 3 is a graph depicting light emission intensity of the body diode after proton irradiation.

FIGS. 2 and 3 are graphs depicting light emission intensity of the body diode after proton irradiation. FIGS. 2 and 3 depict results measured at a temperature of 100 degrees C. when an irradiation amount of the protons is set to $1\times10^{10}/$cm$^2$, $\times10^{11}$/cm$^2$, $5\times10^{11}$/cm$^2$, $1\times10^{12}$/cm$^2$, and $5\times10^{12}$/cm$^2$, and a current at a current density of 300 A/cm$^2$ is passed through the body diode in which the point defects 22 have been introduced. In FIG. 2, a horizontal axis depicts wavelength of light emitted from the body diode in units of nm. A vertical axis depicts light emission count/light intensity emitted from the body diode in units of light emission count. In FIG. 3, a horizontal axis depicts the proton irradiation amount/cm$^2$. A vertical axis depicts the intensity of light emitted from the body diode in units of light emission count.

As depicted in FIGS. 2 and 3, as the proton irradiation amount increases and the concentration of the point defects 22 increases, the light emission percentage at a wavelength close to 390 nm decreases, and the light emission percentage at a wavelength close to 500 nm increases. From the results in FIGS. 2 and 3, the proton irradiation amount may be preferably at least $5\times10^{11}$/cm$^2$ at which light emission at a wavelength close to 390 nm is nearly 0. Here, while an instance in which the point defects 22 due to proton irradiation is depicted, an instance in which the point defects 22 are due to helium irradiation is similar hereto.

Figure 4:
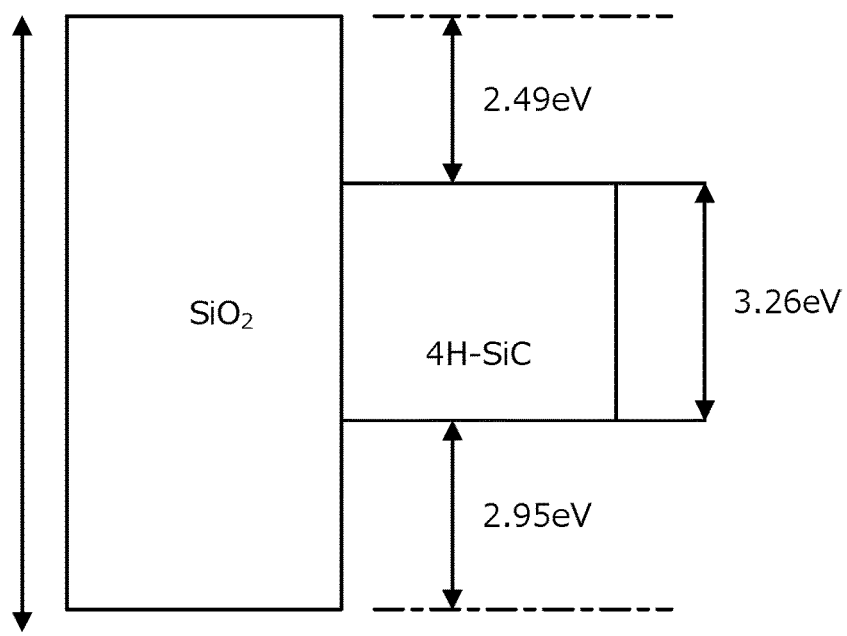
FIG. 4 is a diagram depicting an oxide film, 4H-SiC, and band offset.

FIG. 4 is a diagram depicting an oxide film, 4H-SiC, and band offset. Here, while an instance is depicted in which a side surface of a trench is an m-plane, another plane is similar hereto. As depicted in FIG. 4, band offset between 4-layer periodic hexagonal crystal silicon carbide (4H-SiC) and the SiO$_2$ oxide film constituting gate insulating films 9 is about 2.49 eV (498 nm). Therefore, in the light emission at a wavelength close to 390 nm of high energy, charge is easily trapped in the SiO$_2$ oxide film while in the light emission at a wavelength close to 500 nm of low energy, charge is not easily trapped in the SiO$_2$ oxide film.

Figure 5:
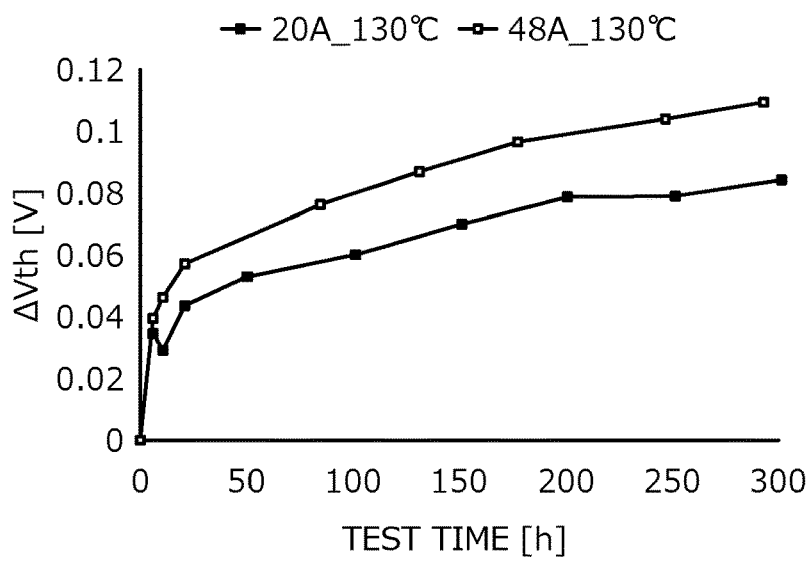
FIG. 5 is a graph depicting current dependency of ΔVth.

FIG. 5 is a graph depicting current dependency of ΔVth. In FIG. 5, measurement results of a pulse width modulation (PWM) drive test at a temperature of 130 degrees C. when currents of 20 A and 48 A are passed through the body diode are depicted. In FIG. 5, a horizontal axis depicts test time in units of h. A horizontal axis depicts threshold voltage fluctuation (ΔVth) in units of V.

As depicted in FIG. 5, fluctuation of the threshold voltage decreases as the current is reduced. Further, the light emission intensity of the body diode is current dependent and when the current is reduced, the light emission intensity of the body diode decreases. This result is suggestive that fluctuation of the threshold voltage may be suppressed by reducing the light emission intensity of the body diode. In an instance in which the point defects 22 are introduced, recombination at defect energy levels occurs, whereby fluctuation of the threshold voltage may be reduced since it is possible to reduce the light emission intensity of the body diode for a wavelength of 390 nm.

On a second main surface (the back surface, i.e., the back surface of the silicon carbide semiconductor base 18) of the n$^+$-type silicon carbide substrate 1, the back electrode 13 constituting the drain electrode is provided. On a surface of the back electrode 13, a drain electrode pad (not depicted) is provided.

At a first main surface side (side having the p-type base layer 6) of the silicon carbide semiconductor base 18, the trench structure is formed. In particular, trenches 16 penetrate through the p-type base layer 6 from a first surface (the first main surface side of the silicon carbide semiconductor base 18) of the p-type base layer 6 opposite to a second surface thereof facing the n$^+$-type silicon carbide substrate 1 and reach the n-type high-concentration regions 5 (in an instance in which the n-type high-concentration regions 5 are omitted, the n$^-$-type silicon carbide epitaxial layer 2, hereinafter, indicated simply as "(2)"). Along inner walls of the trenches 16, the gate insulating films 9 are formed on sidewalls and bottoms of the trenches 16, and gate electrodes 10 are formed on the gate insulating films 9 in the trenches 16. The gate electrodes 10 are insulated from the n-type high-concentration regions 5 (2) and the p-type base layer 6 by the gate insulating films 9. The gate electrodes 10 may partially protrude toward the source electrode 12, from tops (respective sides on which the later-described source electrode 12 is provided) of the trenches 16.

In a surface layer of each of the n-type high-concentration regions 5 (2), at a first side (the first main surface side of the silicon carbide semiconductor base 18) thereof opposite to a second side thereof facing the n$^+$-type silicon carbide substrate 1, first p$^+$-type base regions 3 are provided between the trenches 16. Further, second p$^+$-type base regions 4 respectively in contact with the bottoms of the trenches 16 are provided in the n-type high-concentration regions 5 (2). The second p$^+$-type base regions 4 are provided at positions facing the bottoms of the trenches 16 in a depth direction (a direction from the source electrode 12 to the drain electrode 13). A width of the second p$^+$-type base regions 4 is wider than a width of the trenches 16. The bottoms of the trenches 16 may respectively reach the second p$^+$-type base regions 4 or may be positioned in the n-type high-concentration regions 5 (2), between the p-type base layer 6 and the second p$^+$-type base regions 4, respectively.

In the p-type base layer 6, n$^+$-type source regions (first semiconductor regions of the first conductivity type) 7 are selectively provided at the first main surface side of the silicon carbide semiconductor base 18. Further, p$^+$-type contact regions 8 may be selectively provided. Further, the n$^+$-type source regions 7 and the p$^+$-type contact regions 8 are in contact with one another.

An interlayer insulating film 11 is provided in an entire area of the first main surface side of the silicon carbide semiconductor base 18 so as to cover the gate electrodes 10 embedded in the trenches 16. The source electrode 12 is in contact with the n$^+$-type source regions 7 and the p-type base layer 6 via contact holes opened in the interlayer insulating film 11. Further, in an instance in which the p$^+$-type contact regions 8 are provided, the source electrode 12 is in contact with the n$^+$-type source regions 7, the p-type base layer 6, and the p$^+$-type contact regions 8. The source electrode 12 is electrically insulated from the gate electrodes 10 by the interlayer insulating film 11. On the source electrode 12, a source electrode pad (not depicted) is provided. Between the source electrode 12 and the interlayer insulating film 11, for example, a barrier metal 14 that prevents diffusion of metal atoms from the source electrode 12 to the gate electrodes 10 may be provided.

Next, a method of manufacturing a silicon carbide semiconductor device according to the embodiment is described. FIGS. 6, 7, 8, 9, 10, and 11 are cross-sectional views of states of the silicon carbide semiconductor device according to the embodiment during manufacture.

First, the n$^+$-type silicon carbide substrate 1 containing an n-type silicon carbide is prepared. The n$^+$-type silicon carbide substrate 1 is, for example, about $5.0\times10^{18}/\text{cm}^3$. Further, on the first main surface of the n$^+$-type silicon carbide substrate 1, the n-type boundary layer 20 containing silicon carbide is epitaxially grown and has a thickness of, for example, about 5 μm while an n-type impurity, for example, nitrogen atoms (N) is doped.

Next, on the surface of the n-type boundary layer 20, the high-concentration n$^+$-type buffer layer 21 containing silicon carbide is epitaxially grown and has a thickness in range, for example, from 1 μm to 5 μm while an n-type impurity, for example, nitrogen atoms (N) is doped.

Figure 6:
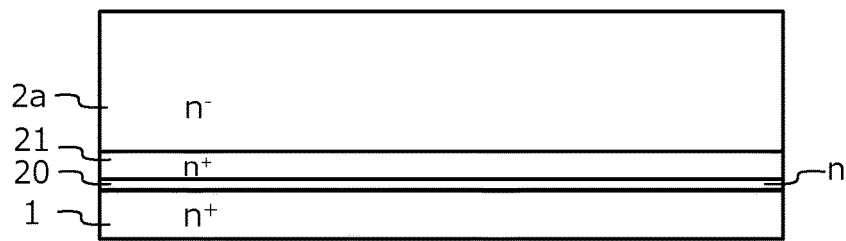
FIG. 6 is a cross-sectional view of a state of the silicon carbide semiconductor device according to the embodiment during manufacture.

Next, on the surface of the high-concentration n$^+$-type buffer layer 21, a lower n$^-$-type silicon carbide epitaxial layer 2a is epitaxially grown and has a thickness of, for example, about 30 μm while an n-type impurity, for example, nitrogen atoms (N) is doped. The state up to here is depicted in FIG. 6.

Next, on the surface of the lower n$^-$-type silicon carbide epitaxial layer 2a, an ion implantation mask having predetermined openings is formed by a photolithographic technique using, for example, an oxide film. Subsequently, a p-type impurity such as aluminum is implanted in the openings of the oxide film, thereby forming lower first p$^+$-type base regions 3a and the second p$^+$-type base regions 4 at a depth of about 0.5 μm.

Figure 7:
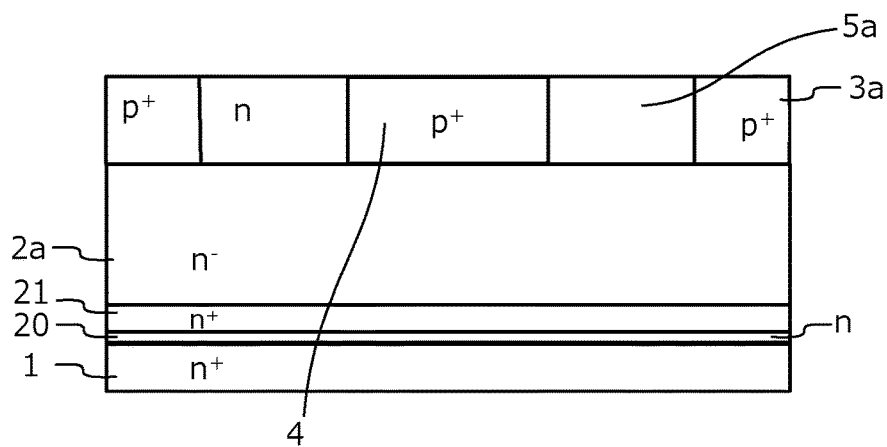
FIG. 7 is a cross-sectional view of a state of the silicon carbide semiconductor device according to the embodiment during manufacture.

Next, the ion plantation mask may be partially removed, an n-type impurity such as nitrogen may be ion-implanted in the openings, whereby in a portion of a surface region of the lower n$^-$-type silicon carbide epitaxial layer 2a, for example, lower n-type high-concentration regions 5a of a depth of about 0.5 μm may be formed. An impurity concentration of the lower n-type high-concentration regions 5a may be set to be, for example, about $1\times10^{17}/\text{cm}^3$. The state up to here is depicted in FIG. 7.

Next, on the surface of the lower n$^-$-type silicon carbide epitaxial layer 2a, an upper n$^-$-type silicon carbide epitaxial layer 2b doped with an n-type impurity such as nitrogen is formed and has a thickness of about 0.5 μm. An impurity concentration of the upper n$^-$-type silicon carbide epitaxial layer 2b is set to be about $3\times10^{15}/\text{cm}^3$. Hereinafter, the lower n$^-$-type silicon carbide epitaxial layer 2a and the upper n$^-$-type silicon carbide epitaxial layer 2b constitute the n$^-$-type silicon carbide epitaxial layer 2.

Next, on the surface of the upper n$^-$-type silicon carbide epitaxial layer 2b, an ion implantation mask having predetermined openings is formed by photolithography using, for example, an oxide film. Subsequently, a p-type impurity such as aluminum is implanted in openings of the oxide film, thereby forming upper first p$^+$-type base regions 3b at a depth of about 0.5 μm, overlapping the lower first p$^+$-type base regions 3a, respectively. The lower first p$^+$-type base regions 3a and the upper first p$^+$-type base regions 3b form continuous regions constituting the first p$^+$-type base regions 3. An impurity concentration of the upper first p$^+$-type base regions 3b is set to be, for example, about $5\times10^{18}/\text{cm}^3$.

Figure 8:
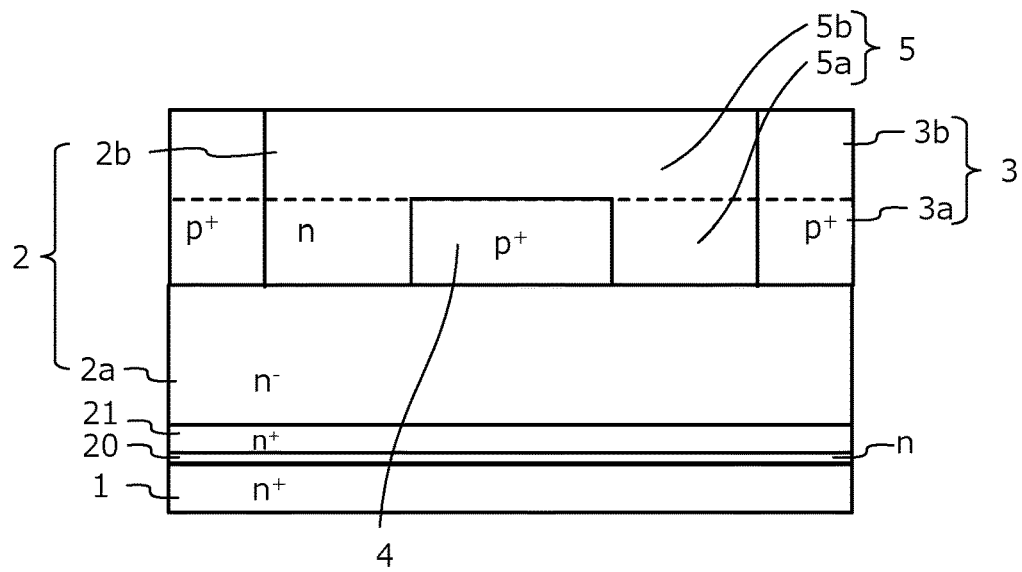
FIG. 8 is a cross-sectional view of a state of the silicon carbide semiconductor device according to the embodiment during manufacture.

Next, the ion plantation mask may be partially removed, an n-type impurity such as nitrogen may be ion-implanted in the openings, whereby in a portion of a surface region of the n⁻-type silicon carbide epitaxial layer 2, for example, upper n-type high-concentration regions 5b at a depth of about 0.5 µm may be formed. An of impurity concentration the upper n-type high-concentration regions 5b may be set to be, for example, about $1 \times 10^{17}/cm^3$. The upper n-type high-concentration regions 5b and the lower n-type high-concentration regions 5a are formed so as to at least partially be in contact with one another, thereby forming the n-type high-concentration regions 5. However, the n-type high-concentration regions 5 may be formed in an entire area of the substrate surface or may be formed only in the active region while a voltage withstanding structure region of an outer periphery of the active region is free of the n-type high-concentration regions 5. The state up to here is depicted in FIG. 8.

Next, on the surface of the n⁻-type silicon carbide epitaxial layer 2, the p-type base layer 6 is formed by epitaxial growth and has a thickness of about 1.1 µm. An impurity concentration of the p-type base layer 6 is set to be about $3.5 \times 10^{16}/cm^3$. After the p-type base layer 6 is formed by epitaxial growth, a p-type impurity such as aluminum may be further ion-implanted in the p-type base layer 6.

Next, in a first main surface layer (surface layer of the p-type base layer 6) of the silicon carbide semiconductor base 18, predetermined regions configuring the MOS gates are formed. In particular, on the surface of the p-type base layer 6, an ion implantation mask having predetermined openings is formed by photolithography using, for example, an oxide film. An n-type impurity such as nitrogen (N) or phosphorus (P) is ion-implanted in the openings, whereby the n⁺-type source regions 7 are formed in portions of the p-type base layer 6, at the surface of the p-type base layer 6. Next, the ion plantation mask used to form the n⁺-type source regions 7 is removed and by a similar method, an ion implantation mask having predetermined openings may be formed, a p-type impurity such as boron may be ion-implanted in a portion of the p-type base layer 6, at the surface of the p-type base layer 6, whereby the p⁺-type contact regions 8 may be formed. An impurity concentration of the p⁺-type contact regions 8 may set to be higher than the impurity concentration of the p-type base layer 6.

Figure 9:
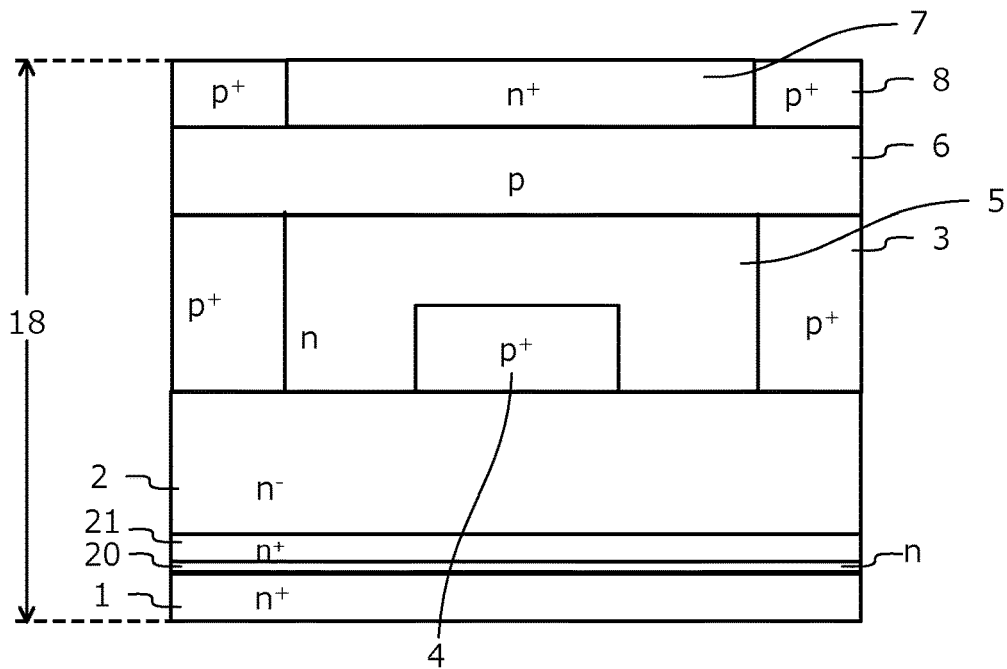
FIG. 9 is a cross-sectional view of a state of the silicon carbide semiconductor device according to the embodiment during manufacture.

Next, a heat treatment (activation annealing) for activating all the regions formed by ion implantation is performed. For example, a heat treatment (annealing) under an inert gas atmosphere at about 1700 degrees C. is performed, thereby implementing an activation treatment for the first p⁺-type base regions 3, the second p⁺-type base regions 4, the n⁺-type source regions 7, and the p⁺-type contact regions 8. As described above, the ion implanted regions may be collectively activated by a single session of the heat treatment or the heat treatment may be performed each time ion implantation is performed. The state up to here is depicted in FIG. 9.

Next, on the surface of the p-type base layer 6, a trench forming mask having predetermined openings is formed by photolithography using, for example, an oxide film. Next, the trenches 16 penetrating through the p-type base layer 6 and reaching the n-type high-concentration regions 5 (2) are formed by dry etching. The bottoms of the trenches 16 may respectively reach the second p⁺-type base regions 4 formed in the n-type high-concentration regions 5 (2). Next, the trench forming mask is removed.

Figure 10:
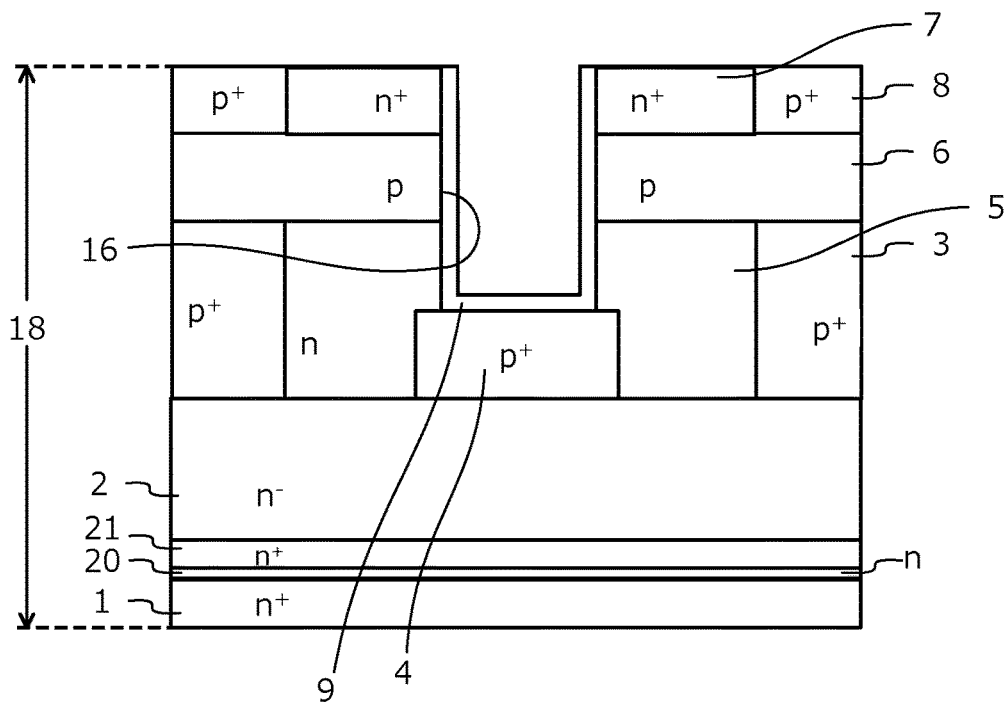
FIG. 10 is a cross-sectional view of a state of the silicon carbide semiconductor device according to the embodiment during manufacture.

Next, the gate insulating films 9 are formed along the surfaces of the n⁺-type source regions 7 and the p⁺-type contact regions 8, and along the bottom and the sidewalls of the trenches 16. The gate insulating films 9 may be formed by thermal oxidation at a temperature of about 1000 degrees C. under an oxygen atmosphere. Further, the gate insulating films 9 may be formed by a deposition method by a chemical reaction such as that for a high temperature oxide (HTO). The state up to here is depicted in FIG. 10.

Next, on the gate insulating films 9, for example, a polycrystalline silicon layer doped with phosphorous atoms is provided. The polycrystalline silicon layer may be formed so as to be embedded in the trenches 16. The polycrystalline silicon layer is patterned by photolithography and left in the trenches 16, whereby the gate electrodes 10 are formed.

Next, for example, phosphate glass is deposited so as to cover the gate insulating films 9 and the gate electrodes 10 and has a thickness of about 1 µm, whereby the interlayer insulating film 11 is formed. Next, the barrier metal 14 containing titanium (Ti) or titanium nitride (TiN) may be formed so as to cover the interlayer insulating film 11. The interlayer insulating film 11 and the gate insulating films 9 are patterned by photolithography, whereby contact holes exposing the n⁺-type source regions 7 and the p⁺-type contact regions 8 are formed. Thereafter, a heat treatment (reflow) is performed, whereby the interlayer insulating film 11 is planarized.

Next, the interlayer insulating film 11 is selectively removed and a nickel (Ni) or a Ti film is deposited on the surface of the silicon carbide semiconductor base 18. Next, the surface is protected and a Ni or a Ti film is deposited on the back surface of the n⁺-type silicon carbide substrate 1. Next, a heat treatment of about 1000 degrees C. is performed, whereby an ohmic electrode on the surface of the silicon carbide semiconductor base 18 and an ohmic electrode on the back surface of the n⁺-type silicon carbide substrate 1 are formed.

Figure 11:
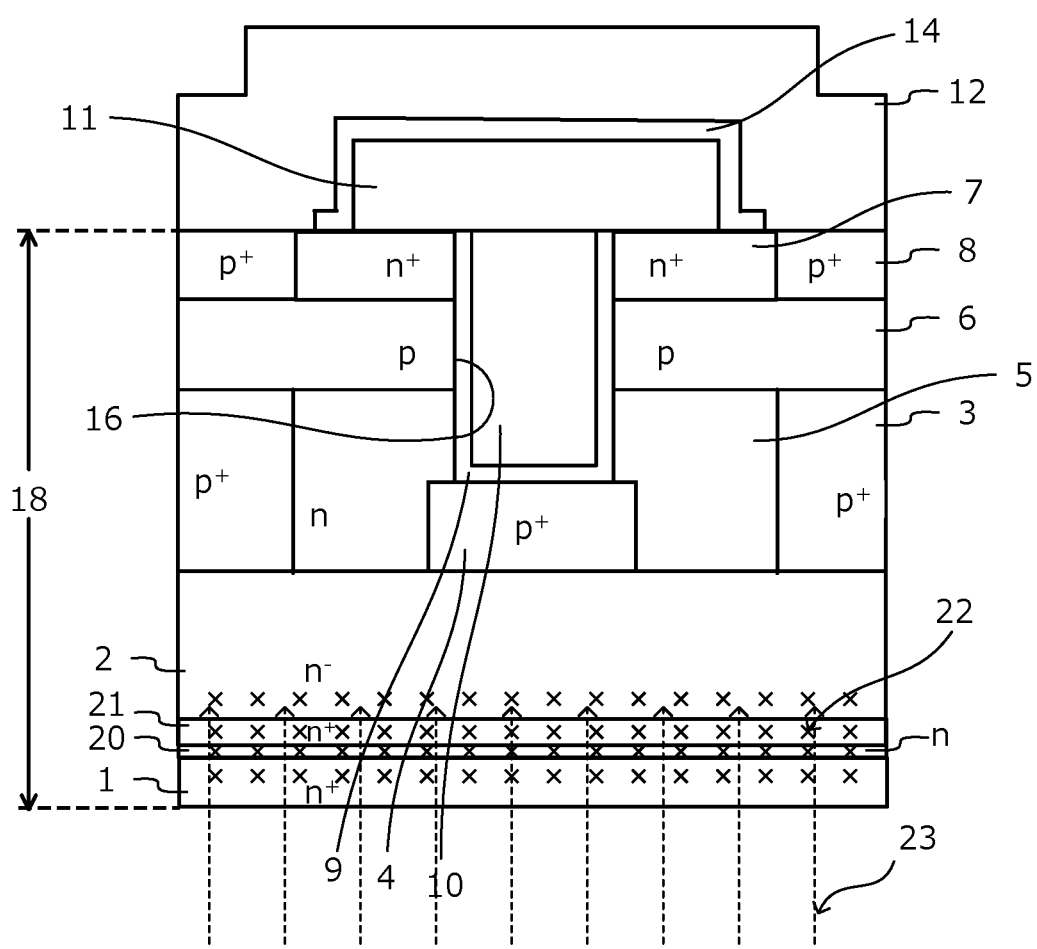
FIG. 11 is a cross-sectional view of a state of the silicon carbide semiconductor device according to the embodiment during manufacture.
Figure 12:
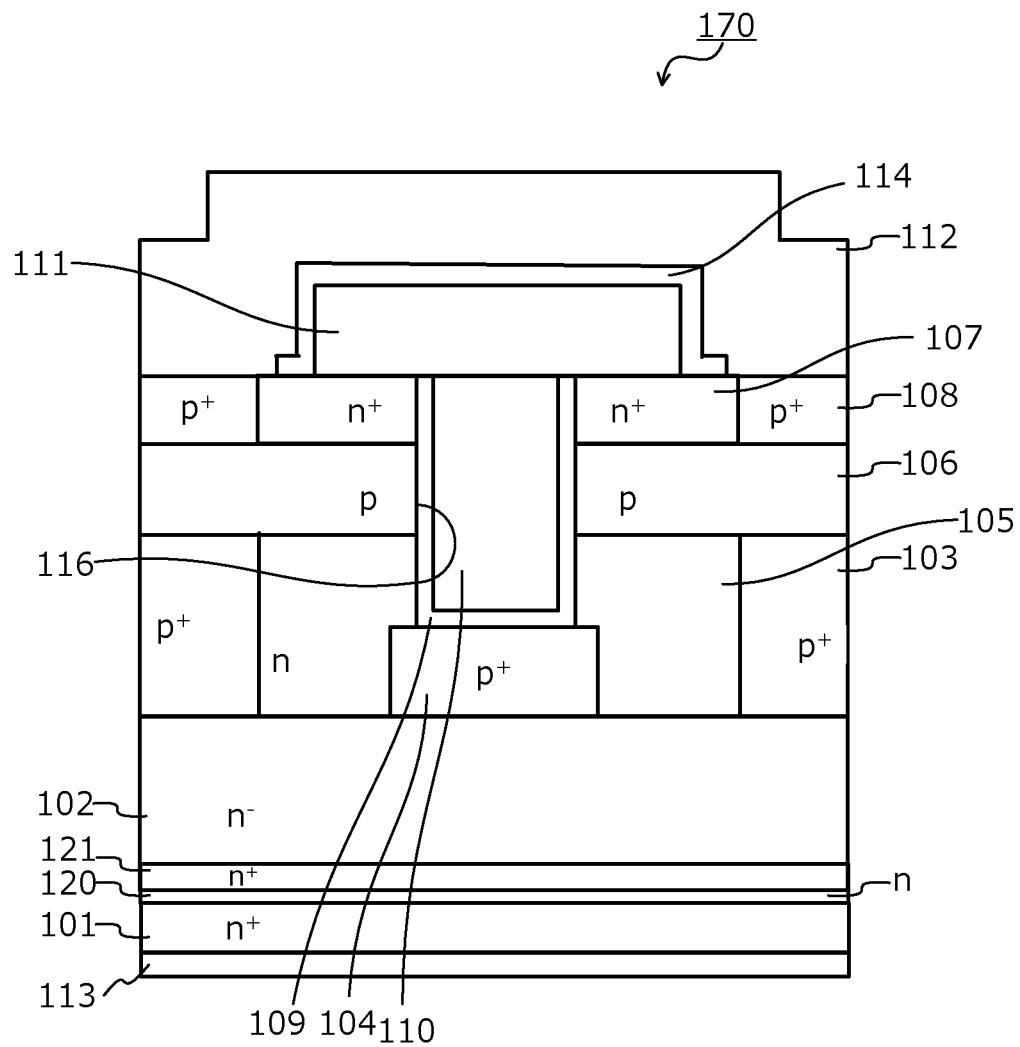
FIG. 12 is a cross-sectional view depicting a trench gate structure of a conventional silicon carbide semiconductor device.

Next, a particle beam irradiation 23 is performed from the back surface side of the n⁺-type silicon carbide substrate 1. The particle beam irradiation 23 irradiates protons. The irradiation amount of the protons may be preferably at least $5 \times 10^{11}/cm^2$. Alternatively, instead of protons, helium may be irradiated. The particle beam irradiation 23 is performed from the substrate so as to introduce the point defects 22 in the drift region. The point defects 22 disappear at a temperature of at least 500 degrees C. and therefore, the particle beam irradiation 23 is performed after the activation annealing. Here, while the particle beam irradiation 23 is performed after an annealing treatment for forming a nickel silicide is performed, the particle beam irradiation 23 may be performed after an annealing treatment for forming the trenches 16. Further, the particle beam irradiation 23 may be preferably performed from the back surface side of the silicon carbide semiconductor base 18. In this instance, effects of the particle beam irradiation 23 on the gate electrodes 10 may be reduced. The state up to here is depicted in FIG. 11.

Next, a conductive film constituting the source electrode 12 is provided on the interlayer insulating film 11 so as to be in contact with the ohmic electrode portion formed in the contact holes, thereby bringing the n⁺-type source regions 7 and the p⁺-type contact regions 8 in contact with the source electrode 12.

Subsequently, the back electrode 13 constituted by, for example, a nickel (Ni) film is formed on the second main surface of the n⁺-type silicon carbide substrate 1. Thereafter, for example, a heat treatment is performed at a temperature of about 970 degrees C., thereby forming an ohmic contact between the n⁺-type silicon carbide substrate 1 and the back electrode 13.

Next, for example, by a sputtering method, an electrode pad constituting the source electrode pad (not depicted) is deposited on the source electrode 12 on the front surface of the silicon carbide semiconductor base 18 and in the openings of the interlayer insulating film 11. A thickness of a portion of the electrode pad on the interlayer insulating film 11 may be, for example, 5 μm. The electrode pad may be formed to contain, for example, aluminum (Al—Si) containing silicon at a rate of 1%. Next, the source electrode pad is selectively removed.

Next, for example, titanium (Ti), nickel (Ni), and gold (Au) are sequentially deposited on the surface of the back electrode 13 as the drain electrode pad (not depicted). As described above, the silicon carbide semiconductor device depicted in FIG. 1 is completed.

As described above, according to the embodiment, point defects are introduced in a range from the substrate to the drift layer. As a result, during body diode conduction, the peak light emission intensity at a wavelength close to 390 nm (an intensity at a first peak) is less than the peak light emission intensity at a wavelength close to 500 nm (an intensity at a second peak). Therefore, the trapping of charge in the $SiO_2$ oxide film may be suppressed, fluctuation of Vth is suppressed, and device characteristics are stabilized. Further, particle beam irradiation is performed from the back surface side of the silicon carbide substrate to form the point defects. As a result, effects of the particle beam irradiation on the gate electrodes may be reduced.

In the foregoing, the present invention may be variously modified within a range not departing from the spirit of the invention and, for example, in the embodiments described above, dimensions, impurity concentrations, etc. of parts may be variously set according to necessary specifications. Further, in the embodiments described above, while description is given taking a trench-gate-type vertical MOSFET as an example, application is further possible to PiN diodes, insulated gate bipolar transistors (IGBTs), etc. Further, in the embodiments, while the first conductivity type is an n-type and the second conductivity type is a p-type, the present invention is similarly implemented when the first conductivity type is a p-type and the second conductivity type is an n-type.

According to the described invention, point defects are introduced in a range from the substrate to the drift layer. As a result, during body diode conduction, the peak light emission intensity at a wavelength close to 390 nm is less than the peak light emission intensity at a wavelength close to 500 nm. Therefore, the trapping of charge in the $SiO_2$ oxide film may be suppressed, fluctuation of Vth is suppressed, and device characteristics are stabilized. Further, the particle beam irradiation is performed from the back surface side of the silicon carbide substrate to form the point defects. As a result, effects of the particle beam irradiation on the gate electrodes may be reduced.

The silicon carbide semiconductor device and the method of manufacturing a silicon carbide semiconductor device according to the present invention achieve an effect in that the trapping of charge in the oxide film is reduced, whereby fluctuation of Vth is suppressed, and device characteristics may be stabilized.

As described above, the silicon carbide semiconductor device and the method of manufacturing a silicon carbide semiconductor device according to the present invention are useful for power semiconductor devices used in power converting equipment such as inverters, power source devices of various industrial machines, igniters of vehicles, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a silicon carbide semiconductor substrate of a first conductivity type, having a first main surface and a second main surface opposite to each other;
a first semiconductor layer of the first conductivity type, provided on the first main surface of the silicon carbide semiconductor substrate, the first semiconductor layer having an impurity concentration lower than an impurity concentration of the silicon carbide semiconductor substrate, the first semiconductor layer having a first surface and a second surface opposite to each other, the second surface facing the silicon carbide semiconductor substrate;
a second semiconductor layer of the first conductivity type, provided on the first surface of the first semiconductor layer, the second semiconductor layer having a first surface and a second surface opposite to each other, the second surface of the second semiconductor layer facing the first semiconductor layer;
a third semiconductor layer of the first conductivity type, provided on the first surface of the second semiconductor layer, the third semiconductor layer having an impurity concentration lower than the impurity concentration of the silicon carbide semiconductor substrate, the third semiconductor layer having a first layer and a second layer on the first layer, the first layer of the third semiconductor layer facing the second semiconductor layer;
a fourth semiconductor layer of a second conductivity type, provided on the second layer of the third semiconductor layer, the fourth semiconductor layer having a first surface and a second surface opposite to each other, the second surface of the fourth semiconductor layer facing the second layer of the third semiconductor layer;
a first semiconductor region of the first conductivity type, selectively provided in the fourth semiconductor layer, at the first surface of in the fourth semiconductor layer;
a gate electrode provided on at least a portion of a surface of the fourth semiconductor layer, between the third semiconductor layer and the first semiconductor region via a gate insulating film;
a first electrode provided on surfaces of the first semiconductor region and the fourth semiconductor layer; and
a second electrode provided on the second main surface of the silicon carbide semiconductor substrate, wherein
a light generated in response to a current flowing from the first electrode to the second electrode has an intensity profile having a first peak and a second peak respectively approximately at 390 nm and 500 nm, and an intensity at the first peak is lower than an intensity at the second peak, and
a portion of the silicon carbide semiconductor substrate, the first semiconductor layer, the second semiconductor layer, and the third semiconductor layer each contain injected protons or helium that introduce point defects, and
the intensity at the first peak is 1/20 or less of the intensity at the second peak.

2. The silicon carbide semiconductor device according to claim 1, wherein the intensity at the first peak is 1/100 or less of the intensity at the second peak.

3. The silicon carbide semiconductor device according to claim 1, wherein the first layer of the third semiconductor layer has an impurity concentration lower than an impurity concentration of the second layer of the third semiconductor layer.

* * * * *